(12) United States Patent
Hingerl et al.

(10) Patent No.: US 10,971,365 B2
(45) Date of Patent: Apr. 6, 2021

(54) METHOD AND DEVICE FOR BONDING SUBSTRATES

(71) Applicant: EV Group E. Thallner GmbH, St. Florian am Inn (AT)

(72) Inventors: Kurt Hingerl, Wolfern (AT); Peter Nikolaus Oberhumer, Gaspoltshofen (AT); Gunther Hesser, Linz (AT)

(73) Assignee: EV Group E. Thallner GmbH, St. Florian am Inn (AT)

( * ) Notice: Subject to any disclaimer, the term of this patent is extended or adjusted under 35 U.S.C. 154(b) by 0 days.

(21) Appl. No.: 16/481,994

(22) PCT Filed: Feb. 21, 2017

(86) PCT No.: PCT/EP2017/053918
§ 371 (c)(1),
(2) Date: Jul. 30, 2019

(87) PCT Pub. No.: WO2018/153434
PCT Pub. Date: Aug. 30, 2018

(65) Prior Publication Data
US 2019/0393037 A1 Dec. 26, 2019

(51) Int. Cl.
*H01L 21/20* (2006.01)
*H01L 21/02* (2006.01)
*H01L 21/268* (2006.01)

(52) U.S. Cl.
CPC .... *H01L 21/2007* (2013.01); *H01L 21/02356* (2013.01); *H01L 21/268* (2013.01)

(58) Field of Classification Search
CPC .......... H01L 21/2007; H01L 21/02356; H01L 21/268
(Continued)

(56) References Cited

U.S. PATENT DOCUMENTS

| 5,441,776 A | 8/1995 | Sterling et al. |
| 7,165,712 B2 * | 1/2007 | Abdo ............... B23K 20/02 148/522 |

(Continued)

FOREIGN PATENT DOCUMENTS

| EP | 2 058 080 A1 | 5/2009 |
| WO | WO-2013/029656 A1 | 3/2013 |

(Continued)

OTHER PUBLICATIONS

Schmidt, Rainer, "Werkstoffverhalten in biologischen Systemen," 1999, Title pages and pp. 58-59, along with English-languge machine translation of p. 58.
(Continued)

*Primary Examiner* — Sheikh Maruf
(74) *Attorney, Agent, or Firm* — Kusner & Jaffe

(57) ABSTRACT

A method for bonding a first substrate with a second substrate, with the following sequence: production of a first amorphous layer on the first substrate and/or production of a second amorphous layer on the second substrate, bonding of the first substrate with the second substrate at the amorphous layer or at the amorphous layers to form a substrate stack, irradiation of the amorphous layer or the amorphous layers with radiation in such a way that the amorphous layer or the amorphous layers is/are transformed into a crystalline layer or crystalline layers.

15 Claims, 3 Drawing Sheets

(58) Field of Classification Search
USPC .......................................................... 438/455
See application file for complete search history.

(56) References Cited

U.S. PATENT DOCUMENTS

| | | | |
|---|---|---|---|
| 7,462,552 B2 | 12/2008 | Tong et al. | |
| 9,640,510 B2 | 5/2017 | Rebhan | |
| 9,960,030 B2 | 5/2018 | Razek | |
| 10,083,854 B2 | 9/2018 | Wimplinger | |
| 10,163,681 B2 | 12/2018 | Martinschitz et al. | |
| 2001/0019877 A1* | 9/2001 | Miyake | C30B 29/06 438/481 |
| 2001/0045352 A1* | 11/2001 | Robinson | C23C 14/46 204/192.11 |
| 2002/0096106 A1* | 7/2002 | Kub | H01L 21/2007 117/94 |
| 2003/0008475 A1* | 1/2003 | Cheung | H01L 21/76251 438/455 |
| 2003/0008477 A1* | 1/2003 | Kang | H01L 21/3065 438/458 |
| 2003/0219959 A1* | 11/2003 | Ghyselen | H01L 29/165 438/458 |
| 2004/0226162 A1* | 11/2004 | Miura | H03H 9/02574 29/594 |
| 2005/0215028 A1* | 9/2005 | Wei | C04B 37/04 438/455 |
| 2006/0068563 A1* | 3/2006 | Wong | H01L 21/76254 438/455 |
| 2006/0140829 A1* | 6/2006 | Tabata | B01J 19/0093 422/198 |
| 2006/0177993 A1* | 8/2006 | Endo | H01L 21/76254 438/458 |
| 2006/0264004 A1* | 11/2006 | Tong | H01L 21/76254 438/455 |
| 2009/0298258 A1* | 12/2009 | de Souza | H01L 21/76251 438/455 |
| 2010/0000663 A1* | 1/2010 | Goto | C23C 14/3464 156/151 |
| 2011/0192343 A1* | 8/2011 | Abir | H01L 21/76254 117/106 |
| 2011/0201177 A1* | 8/2011 | Fournel | H01L 21/76254 438/458 |
| 2013/0112650 A1 | 5/2013 | Karam et al. | |
| 2014/0230990 A1 | 8/2014 | Karam et al. | |
| 2015/0132923 A1* | 5/2015 | Gaudin | H01L 21/02592 438/459 |
| 2015/0155299 A1* | 6/2015 | Kitada | H01L 29/78603 428/448 |
| 2017/0025306 A1* | 1/2017 | Wang | H01L 21/02592 |
| 2018/0204717 A1 | 7/2018 | Razek | |
| 2018/0366366 A1 | 12/2018 | Wimplinger | |

FOREIGN PATENT DOCUMENTS

| | | |
|---|---|---|
| WO | WO-2015/000527 A1 | 1/2015 |
| WO | WO-2015/149846 A1 | 10/2015 |
| WO | WO-2015/197112 A1 | 12/2015 |

OTHER PUBLICATIONS

International Search Report from corresponding International Patent Application No. PCT/EP2017/053918, dated Oct. 19, 2017.

* cited by examiner

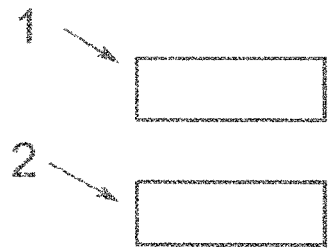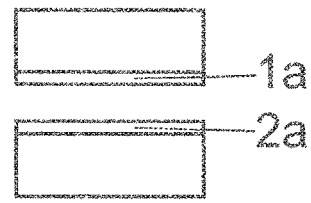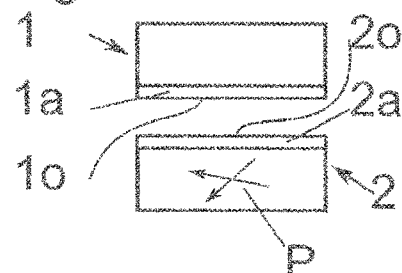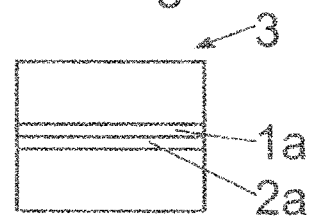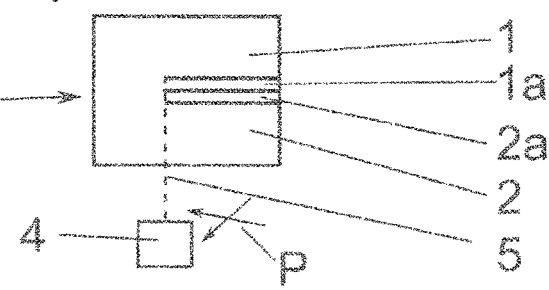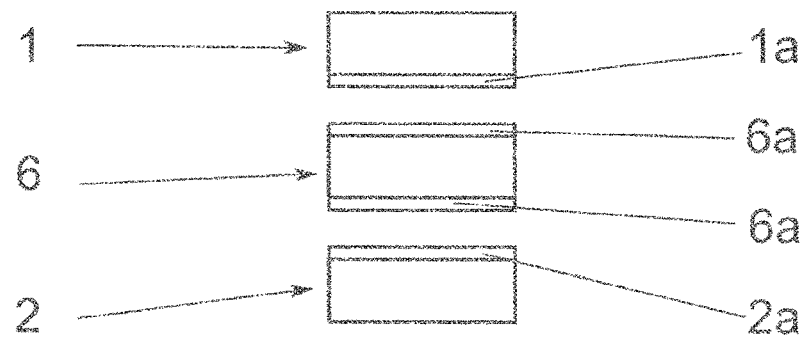

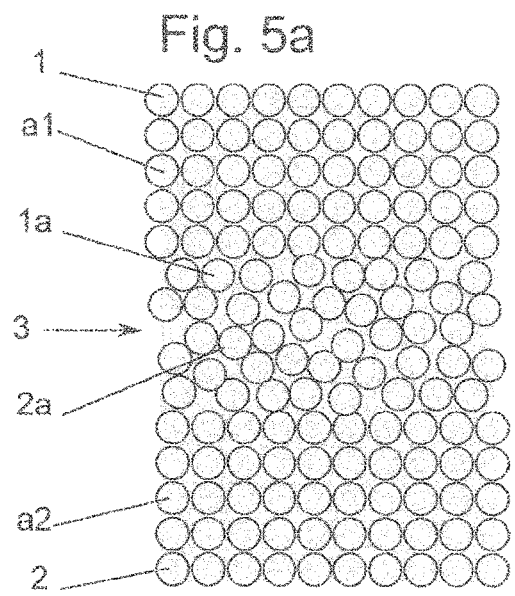
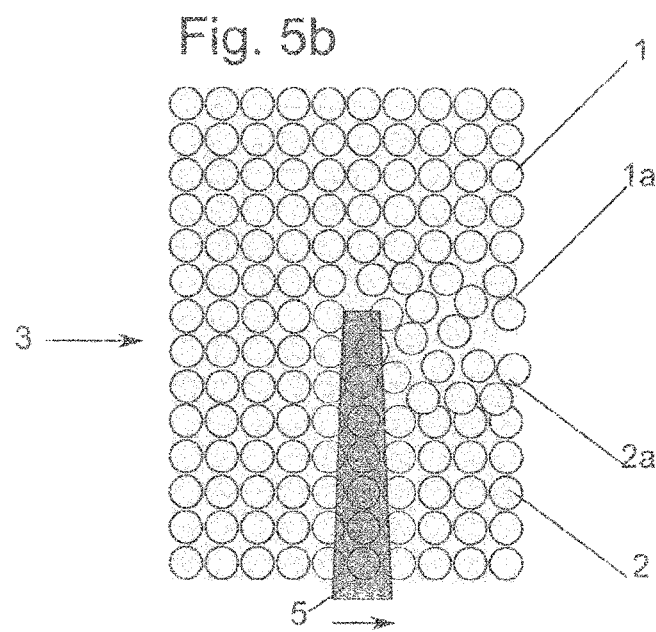
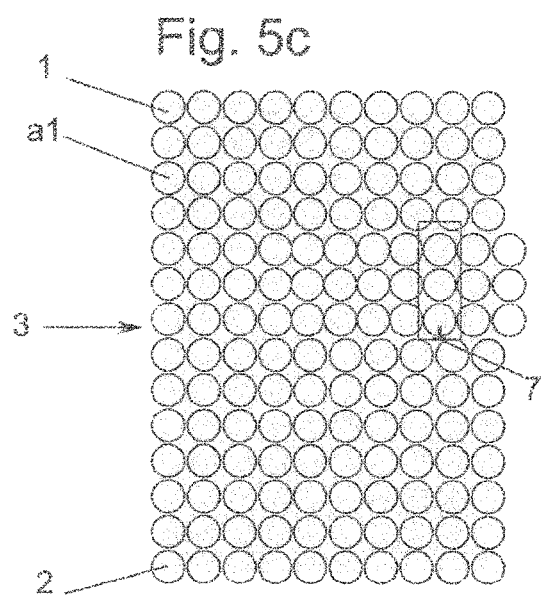

METHOD AND DEVICE FOR BONDING SUBSTRATES

FIELD OF THE INVENTION

The present invention relates to a method and a device for bonding substrates as well as a substrate stack according to the claims.

BACKGROUND OF THE INVENTION

In the semiconductor industry, different bonding technologies have already been used for a number of years to join substrates together. The joining process is referred to as bonding. A distinction is made in particular between the temporary bonding methods and the permanent bonding methods.

In the case of the temporary bonding methods, a product substrate is bonded in particular with a carrier substrate in such a way that it can be detached again after processing. It is possible with the aid of the temporary bonding process to stabilise the product substrate mechanically. The mechanical stabilisation guarantees that the product substrate can be handled without becoming arched, deformed or breaking. Stabilisations by the carrier substrates are primarily required during and after a back-thinning process. A back-thinning process permits the reduction of the product substrate thickness to several microns.

In the case of permanent bonding methods, at least two substrates are bonded together durably, permanently. The permanent bonding of two substrates also permits the production of multi-layer structures. These multi-layer structures can be comprised of the same or of different materials.

The permanent bonding method of anodic bonding is used for bonding ion-containing substrates permanently together. In most cases, one of the two substrates is a glass substrate.

A further permanent bonding method is metal bonding. In the case of metal bonding, an alloy is provided between the substrates to be bonded or a homo-atomic bonding i.e. comprising only one type of atom, takes place. The liquid phase solidifies in an optional solidification process and forms the bonding layer between the two substrates. Bonding without the formation of a molten phase is also conceivable.

A further permanent bonding method is fusion bonding, also referred to as direct bonding. In the case of fusion bonding, two plane, pure substrate surfaces are bonded together by contacting. The bonding process is split up into two steps. In a first step, contacting of the two substrates takes place. The fixing of the two substrates mainly takes place by van der Waals forces. The fixing is referred to as a prebond. These forces allow a fixing to be produced which is strong enough to bond the substrates together so firmly that a mutual displacement, in particular due to the application of a shear force, is now only possible with considerable expenditure of force. On the other hand, the two substrates can be separated again from one another relatively easily, in particular by the application of a normal force. Normal forces preferably engage at the edge, in order to bring about a wedge effect in the interface between the two substrates, which generates a running crack and thus separates the two substrates from one another again. In order to produce a permanent fusion bond, the substrate stack undergoes a heat treatment, also referred to as annealing. The heat treatment leads to the formation of covalent bonds between the surfaces of the two substrates. A permanent bond produced in this way is now only detachable by the use of a correspondingly high force, in most cases involving destruction of the substrates.

The heat treatment required to produce the bonding strength also presents technical challenges. The bonded substrates have often already been provided with functional units such as for example microchips, MEMs, sensors, LEDs, which have a temperature sensitivity. Microchips in particular have a relatively high degree of doping. At raised temperatures, the doping elements have an increased diffusion capacity, which can lead to an undesired, disadvantageous distribution of the doping in the substrate. Furthermore, heat treatments are always associated with raised temperatures and therefore also with increased costs, with the creation of thermal stresses, thermally induced displacements and with longer process times for the heating and cooling. Bonding should therefore take place at the lowest possible temperatures.

Further methods for direct bonding represent surface-activated direct bonds. The surface energy of the bond is increased with the aid of a surface activation of at least one of the substrates, so that bond strengths arise at room temperature which are comparable with the strength of the substrate material.

There are various approaches to a surface activation, with the aid of which the heat treatment temperature and/or duration can be reduced. A plasma treatment or an ion beam treatment can be used for the treatment of the surfaces to be bonded. Empirically, most, if not even all, surface activation methods are accompanied by an amorphisation of the surfaces to be bonded.

A plasma treatment for the cleaning and activation of a substrate surface would be one option for bonding at relatively low temperatures. Such plasma methods, however, do not work, or only work with great difficulty, in the case of surfaces with a high affinity for oxygen, in particular with metal surfaces. Metals with a high affinity for oxygen oxidise and generally form relatively stable oxides. The oxides are in turn a hindrance to the bonding process. Such oxidised metals can also be relatively difficult to bond together by diffusion bonds. On the other hand, the bonding of plasma-activated, in particular monocrystalline silicon, which forms a silicon dioxide layer, works very well. The silicon dioxide layer is eminently well suited for bonding. These negative effects of the oxides therefore do not necessarily relate to all material classes.

Publication U.S. Pat. No. 5,441,776 describes a method for bonding a first electrode to a hydrogenated, amorphous silicon layer. This amorphous silicon layer is deposited on the surface of a substrate by deposition processes.

Publication U.S. Pat. No. 7,462,552B2 shows a method in which a chemical vapour deposition (CVD) is used, in order to deposit an amorphous silicon layer on the surface of a substrate. The amorphous layer has a thickness between 0.5 and 10 µm.

There are several approaches in the literature which described direct bonding at lower temperature. An approach in PCT/EP2013/064239 includes the application of a sacrificial layer, which is dissolved in the substrate material during and/or after the bonding process. A further approach in PCT/EP2011/064874 describes the production of a permanent bond by phase transformations. The mentioned publications relate in particular to metal surfaces, which are more likely bonded by means of metal bonding and not by means of covalent bonds. In PCT/EP2014/056545, an optimised direct bonding method of silicon by surface cleaning is described.

A further approach is represented by WO2015197112A1, in which many of the drawbacks of the mentioned technologies are reduced. Thus, the bonding layer is kept to a thickness of several 10 nm, so that the optical properties of the stack in particular are influenced only slightly.

A kind of weld joint is represented by publications US20130112650A1 and US20140230990A1, wherein metal layers are deposited on the surfaces to be bonded, which metal layers are locally melted by means of laser beam. At least linear bonds thus arise, with which the substrates can be bonded.

All the mentioned methods and bonding devices produce a bonded substrate stack after a jointing process. However, either additional materials such as metals and/or their ions are used in all the methods oder oxides and/or nitrides of the substrates are formed and bonded together.

SUMMARY OF THE INVENTION

A problem to be solved by the present invention is to remove the drawbacks of the prior art and in particular to achieve a better bonding result.

This problem is solved with the subject-matter of the coordinated claims. Advantageous developments of the invention are stated in the sub-claims. All combinations of at least two of the features stated in the description, the claims and/or the drawings also fall within the scope of the invention. In the case of value ranges, values also lying within the stated limits are also intended to be disclosed as limiting values and can be claimed in any combination.

According to the invention, a method for bonding a first substrate with a second substrate is provided, with the following sequence:

production of a first amorphous layer on the first substrate and/or production of a second amorphous layer on the second substrate, bonding of the first substrate with the second substrate at the amorphous layer or at the amorphous layers to form a substrate stack, irradiation of the amorphous layer or the amorphous layers with radiation in such a way that the amorphous layer or the amorphous layers is/are transformed into a crystalline layer or crystalline layers.

Also, according to the invention, a device for bonding a first substrate with a second substrate is provided, in particular using a method according to the invention, comprising:

a receiving means for receiving the substrates,
a bonding device for bonding the substrates,
an irradiation device, wherein the device is constituted in such a way that a first amorphous layer can be produced on the first substrate and/or a second amorphous layer can be produced on the second substrate, that the first substrate can be bonded with the second substrate at the amorphous layer or at the amorphous layers for the formation of a substrate stack, that the amorphous layer or the amorphous layers can be irradiated with radiation by means of the irradiation device, in such a way that the amorphous layer or the amorphous layers can be transformed into a crystalline layer or crystalline layers.

Also according to the invention, a substrate stack is provided, which has been bonded using a device according to the invention and/or a method according to the invention.

According to the invention, two individual substrates can be bonded together. A substrate can however also be bonded with a substrate stack or two substrate stacks can be bonded together. A substrate stack comprises two or more bonded substrates.

A substrate or substrate stack to be bonded can have an amorphous layer on one side only or can have an amorphous layer on both sides.

For the purpose of simplification, substrate is always intended in the following to mean both a single substrate as well as a substrate stack, unless anything is stated to the contrary.

A basic idea of the invention is that good prefixing (prebonding) of the substrates is produced by the at least one amorphous layer and a substrate stack bonded largely transition-free is produced by the transformation of the amorphous layer(s). According to the invention, the generated heat is relatively small with the correct selection of the laser wavelength and is limited locally to the amorphous layer(s). Stresses in the substrate stack can thus be significantly reduced. In addition, the process times are comparatively short.

The at least one amorphous layer is produced at least on a partial region of the substrate surface, so that a sufficiently strong prebond can be achieved. The at least one amorphous layer is preferably produced on the entire substrate surface, so that a prebond with maximum strength can be achieved. It is however also conceivable for the amorphous layer to be produced only in partial regions of the substrate surface, in particular in the case of the conducting surface regions of a hybrid bond.

During the irradiation of the amorphous layer(s), bonds of the substrates arising in particular due to the van der Waals forces are transformed into firm, in particular atomic, bonds, in particular into covalent bonds, and defects present are closed.

According to the invention, at least one of the substrates is covered with an amorphous layer. If only one of the substrates is covered with an amorphous layer and the other substrate is not covered with amorphous layer, the substrates are bonded together at the amorphous layer.

An amorphous layer is preferably produced on both substrates and the substrates are bonded together at the amorphous layers. A particularly firm prebond can advantageously thus be produced.

At least one of the substrates is preferably a crystalline substrate, particularly preferably a monocrystalline substrate. Very particularly preferably, both substrates are crystalline substrates, more preferably monocrystalline substrates. Advantageously, the radiation can thus reach the amorphous layer(s) largely undisrupted, so that heating of the substrates is minimised, as a result of which stresses in the substrate stack are minimised. It is also conceivable for the substrates to be polycrystalline, in particular even nanocrystalline. Especially in the case of hybrid bonds, known to the person skilled in the art, the electrically conductive regions to be bonded together are preferably polycrystalline, in particular comprising polycrystalline copper. In such cases, the method according to the invention can also be used only on partial regions of a substrate, if need be, and does not necessarily have to take place over the entire area of the substrate. The full-area amorphisation of all the dielectric and electrical regions of a hybrid surface is however particularly preferable, especially because the hybrid surface can be amorphised at the same time.

According to the invention, the at least one amorphous layer is transformed at least in regions into a crystalline layer, so that a largely transition-free substrate stack is produced. The at least one amorphous layer is preferably transformed predominantly into a crystalline layer, very particularly preferably completely. An almost completely transition-free or a completely transition-free substrate stack can thus advantageously be produced.

According to the invention, the amorphous layer is produced at least on a partial region of the surface (also referred to below as the bonding surface) of the substrate/substrates to be bonded. An amorphous layer is preferably produced on the predominant part of the bonding surface of the substrate/substrates. Particularly preferably, an amorphous layer is produced on the entire bonding surface of the substrate/substrates. A particularly firm prebond can thus advantageously be produced and a largely or completely transition-free substrate stack can be produced.

Furthermore, provision is made such that the crystalline phase of the first and/or the second substrate is at least 50%, preferably at least 70%, still more preferably at least 90%, most preferably at least 95%, with utmost preference at least 99% transparent for the employed radiation of a radiation source. The radiation can thus reach the amorphous layer(s) largely unhindered, so that a transformation of the amorphous layer(s) through the substrate is possible. The entire amorphous layer or layers can thus advantageously be reached by the radiation. In addition, the radiation source of the radiation can advantageously be arranged on the rear side of the substrates. The rear side is the side of the substrate that is facing away from the bonding surface.

According to the invention, the at least one amorphous layer at least partially absorbs the radiation. More than 50% of the radiant energy of the radiation is preferably absorbed, more preferably more than 70%, particularly preferably more than 80%, very particularly preferably more than 90%. A particularly efficient transformation into the crystalline phase can thus advantageously take place.

The radiation is preferably laser radiation. This is focused on the at least one amorphous layer and thus acts only on the at least one amorphous layer. The thermal load on the substrate stack and therefore the induced mechanical stresses are thus advantageously reduced.

Furthermore, provision is preferably made such that the radiation strikes the amorphous layer(s) at right angles. Right angles includes any deviation of less than ±5 degrees, preferably less than ±3 degrees, particularly preferably less than ±1 degree from the normal. The radiation can thus be absorbed in the optimum manner by the at least one amorphous layer, so that a particularly efficient transformation into the crystalline phase can be achieved. In addition, the irradiation can take place from the rear side of the substrate or the substrates, as a result of which the entire amorphous layer or the entire amorphous layers can be reached by the radiation. In addition, the arrangement of the radiation source(s) and the substrates can be simplified, since irradiation from the side is not necessary.

Furthermore, provision is preferably made such that the radiation is generated by a broadband emitter, which emits in the energy range between 1 eV and 10E6 eV, preferably between 1 eV and 10E3 eV, still more preferably between 1 eV and 10 eV, most preferably between 1 eV and 3 eV. Advantageously, the radiation in these energy ranges is passed through the substrate or the substrates largely unhindered and is absorbed by the amorphous layer(s), so that the transformation into the crystalline phase can take place. The entire amorphous layer or the entire amorphous layers can thus be reached and irradiation from the rear side of the substrate or the substrates can take place.

Furthermore, provision is preferably made such that the radiant power of the radiation lies between 0.01 Watt and 10000 Watt, preferably between 0.1 Watt and 1000 Watt, most preferably between 1 Watt and 100 Watt. In these power ranges, the at least one amorphous layer can be brought to the optimum temperature, so that the transformation into the crystalline phase can take place.

Furthermore, provision is preferably made such that temperatures of over 200° C. are produced by the radiation in the amorphous layer(s), preferably over 400° C., particularly preferably over 600° C., still more preferably over 800° C., most preferably over 1200° C. A particularly efficient transformation into the crystalline phase can advantageously take place in these temperature ranges.

Furthermore, provision is preferably made such that the irradiation time on a point lies below 30 s, preferably below 15 s, particularly preferably below 1 s, very particularly preferably below 100 ms. A transformation into the crystalline phase can be achieved in these time ranges, so that a considerable reduction in process times can be achieved, since only the amorphous layer(s) are irradiated.

Furthermore, provision is preferably made such that a reflection of the radiation at the substrates surfaces and/or substrate stack surfaces amounts to less than 4% of an output intensity of a radiation source, preferably less than 3%, particularly preferably less than 1%. The energy loss when the radiation enters into the substrate(s) is thus minimised, so that the maximum energy for the transformation of the amorphous layer(s) into the crystalline phase can be used.

In particular, at least one antireflection layer and/or at least one moth-eye structure is deposited on the side(s) of the substrate or the substrates which lies/lie opposite the bonding surface(s), wherein a liquid and/or a liquid film is in particular arranged between the radiation source and the substrate surface.

The transmission, the ratio between the intensity at the surface at which the radiation enters and the residual intensity at the amorphous bonding interface according to the invention depends according to the Lambert-Beer law on the length of the transmission path through the material and the absorption coefficient of the material. The latter is a function of the wavelength. The stated percentage transmission values therefore preferably apply to all material/thickness/wavelength combinations, in the sense that according to the invention a transmission as high as possible through the crystalline phase of the given material used with a given thickness and wavelength is sought.

The energy loss when the radiation passes through the substrate(s) is thus minimised, so that the maximum energy for the transformation of the amorphous layer(s) into the crystalline phase can be used.

A fluctuation of the transparency depending on a wavelength of the radiation lies here below 10%, preferably below 5%, particularly preferably below 3%, very particularly preferably below 1%.

Furthermore, provision is preferably made such that, before and/or during the irradiation, heating of at least one of the substrates, preferably of both substrates, takes place, wherein the substrate(s) are heated above 25° C., preferably above 150° C., particularly preferably above 300° C. The transformation of the at least one amorphous layer into the crystalline phase can be advantageously assisted and facilitated by the heating.

Furthermore, provision is preferably made such that the amorphous layer(s) is/are produced by amorphisation processes, in particular ion beam processes and/or plasma processes, wherein particles striking the substrate or the substrates have energies between 0.01 eV and 1000 eV, preferably between 0.1 eV and 100 eV, still more preferably between 1 eV and 10 eV.

The penetration depth of the particles into the substrate is greater than 0 nm, preferably greater than 5 nm, still more preferably greater than 10 nm, most preferably greater than 25 nm, with utmost preference greater than 50 nm.

The thickness(es) of the amorphous layer(s) is/are preferably less than 50 nm, preferably less than 20 nm, particularly preferably less than 10 nm, very particularly preferably less than 5 nm, in the optimum case less than 2 nm, in the ideal case less than 1 nm. A transition-free substrate stack can thus advantageously be created.

The variation in the thickness(es) of the amorphous layer(s) is preferably less than 20 times the lattice constant of the substrate crystals, preferably less than 10 times the lattice constant of the substrate crystal, particularly preferably less than 5 times the lattice constant of the substrate crystal. A uniform amorphous layer can thus advantageously be produced, as a result of which the crystallisation is facilitated and a transition-free substrate stack can be created.

The first substrate and/or the second substrate is preferably freed at least partially from a natural oxide layer before the amorphous layer(s) is/are produced. Interfering influences of oxides are thus removed. The crystallisation can thus be facilitated and a transition-free substrate stack created.

The amorphous layer(s) is/are preferably produced by the following methods:
chemical vapour deposition (CVD),
physical vapour deposition (PVD),
plasma treatment or
ion beam treatment.

In a very preferred embodiment according to the invention, an existing crystalline substrate surface is amorphised, in particular by ion bombardment. It is however feasible, but less preferable, for an amorphous layer to be deposited on an existing crystalline substrate surface.

A basic idea of the invention is in particular that the differences in the absorption of different phases of a substrate are utilised primarily to heat the bonding interface. At least one substrate can be crystalline, in particular monocrystalline. At least one of the substrates should comprise an amorphous layer.

The, in particular crystalline, substrate or the, in particular crystalline, substrates should have a low absorption, a high transmission and a low reflection for the radiation. The amorphous layer has, in return, a high absorption, a low transmission and low reflection for the radiation. The radiation is thus converted chiefly in the bonding interface (i.e. at the bonding interfaces).

A large part of the radiation is absorbed in the amorphous layer or the amorphous layers and converted into heat, so that an increased thermal motion of the atoms in the amorphous layer or the amorphous layers leads to a rearrangement of the atoms. In particular, a phase transformation of the amorphous phase or phases into the crystalline phase or phases takes place at the bonding interface.

A substrate stack with a relatively perfect, in particular monocrystalline, lattice can thus be produced. The lattice thus arising may in fact still exhibit dislocations, which however do not significantly impair the achieved result.

An idea according to the invention is the fact that a substrate stack bonded with a prebond is treated locally by means of radiation, in such a way that the amorphous state of the bonding interface and its surroundings are transformed into the crystalline state. The bond strength is also increased by the disappearance of the amorphous bonding interface between the two substrates. In particular, the electrical properties of the bonding interface are also improved by the extensive transformation into the crystalline phase. For example, a predominantly ohmic transition can thus preferably be guaranteed. This means for example that a threshold voltage/breakdown voltage of a diode portion makes up less than 10% of the total voltage drop at the transition.

The simplification of the methods for bonding is advantageous for the invention. By means of suitable material pairings and material use of the substrate, a bond can arise without foreign-atom or foreign-ion loading. Homogeneous perfect crystals, at most except for several lattice defects, in particular vacancies and dislocations, are bonded together, so that the electrical properties are further optimised and improved.

The present invention uses, in particular electromagnetic, radiation to transform the amorphous bonding interface of the substrate stack by means of phase transformation into the crystalline phase and thus to bond the substrates of the substrate stack inseparably together.

The method according to the invention preferably uses the following process steps, which can be carried out in any sequence:
production of an amorphised layer on the substrate surfaces to be bonded,
cleaning of the substrates surfaces,
alignment of the substrates with one another,
prebond by means of direct bonding,
laser treatment accorded to the invention to remove the bonding interface.

The invention is based on the fact that different phases exhibit a very different absorption capacity in specific energy ranges or wavelength ranges.

At specific wavelengths and/or wavelength ranges, crystalline phases of substrate materials have a high degree of transmission, a low degree of absorption and a low degree of reflection. Radiation can thus pass through the crystalline phase virtually unhindered.

At the same specific wavelengths and/or wavelength ranges, amorphous phases of substrate materials have a low degree of transmission, a high degree of absorption and a low degree of reflection. The radiation is thus absorbed predominantly by the amorphous phase.

The absorption of the radiation leads to a, in particular local, targeted heating of the amorphous phase. Heating is identical to an increase in the energy content or to an increase in the thermal motion. According to the invention, it is possible to achieve a thermal motion state in the amorphous phase which is so high that a phase transformation, in particular crystallisation, occurs.

According to the invention, the amorphous phase will be rearranged during and/or after the heating input and will therefore crystallise. According to the invention, this phase transformation takes place in the amorphous phase of the bonding interface. The effect of the energy input is that the system is brought over a threshold energy that is required to enable crystallisation. The total energy of the crystalline system, however, is less than that of the amorphous system. The system thus basically tends towards the crystalline structure.

A local phase transformation, in particular crystallisation of the bonding interface, thus leads to healing of the bonding interface.

The present invention controls or regulates the necessary physical effects and boundary conditions by means of parameter sets or formulations, wherein formulations are optimised value collections of parameters, which are connected in functional or process terms. The use of formulations permits the reproducibility of processes. These include:

Material: substrate geometry with shape and position tolerances according to semi-standards and other specifications, evenness and waviness of the substrates, substrate material, doping, amorphisation, layer thickness of the amorphous layer, Material pairing: if substrates with the same amorphous layer, but different material in the substrate volume (bulk) are bonded, or if the substrates are virtually identical to one another.

Substrate preparation: cleanliness of substrates, foreign atom load, interstratification of atomic water layers or gases on the surfaces to be bonded and in the interlayers.

Radiation input of the radiation with wavelength, duration of action, angle of incidence.

Ambient conditions for the substrate stack: temperature, atmosphere.

The substrates can have any arbitrary shape, but are preferably round. The diameter of the substrates is in particular standardised industrially. For wafers, the industry-standard diameters are 1 inch, 2 inch, 3 inch, 4 inch, 5 inch, 6 inch, 8 inch, 12 inch and 18 inch. The embodiment according to the invention, however, can basically handle any substrate irrespective of its diameter. Non-round substrates (in particular rectangular panels, wafer fragments) are also intended to be handled.

Subsequently, evenness will be used as a measure of the perfection of a planar face, in particular a surface. Deviations from a planar surface arise due to waviness and roughness. The waviness of a surface is characterised by a certain periodic elevation and depression of the surface, in particular in the millimeter range, less often in the micron range. Roughness, on the other hand, is more of an aperiodic phenomenon in the micrometer or nanometer range. The precise definition of such surface properties is known to every expert in surface physics, tribology, mechanical engineering or materials sciences.

The substrate surface and its deviation from a mathematical plane can be regarded as a superimposition of waviness and roughness. According to the invention, it is advantageous that the surfaces to be bonded have a minimum deviation from the perfect, mathematical plane. In order to deal with the various deviations from the ideal surface, the term roughness will be used synonymously for the superimposition of all such effects in the remaining part of the patent specification. The roughness is indicated either as a mean roughness, a quadratic roughness or as an averaged roughness depth. The ascertained values for the mean roughness, the quadratic roughness and the averaged roughness depth generally differ for the same measurement section or measurement area, but lie in the same range of order of magnitude. Consequently, the following numerical value ranges for the roughness are to be understood either as values of the mean roughness, the quadratic roughness or of the averaged roughness depth. The roughness is less than 100 nm, preferably less than 10 nm, more preferably less than 5 nm, most preferably less than 3 nm, with utmost preference less than 2 nm.

Substrate materials can be both wafers available in the trade, i.e. element semiconductors, compound semiconductors and organic semiconductors.

Here, however, use is chiefly made of semiconductors which contain elements such as silicon, and/or germanium, and/or carbon and/or tellurium and/or aluminium and/or indium and/or gallium, in particular as main components.

Apart from the substrate material, which in particular should be as transparent as possible for the radiation used, other materials can be used in order to influence the physical properties of the substrate material. Insofar as the materials are dissolved in the substrate material, it involves a solution in the ppm (parts per million) range, also referred to as doping.

Doping influences the electronic and electromagnetic properties of the substrates. Accordingly, doping has an influence on the substrate material, its transparency and its absorption. Furthermore, it is conceivable to produce corresponding predetermined breaking points in the substrate with the aid of doping.

Amorphisation is a phase transformation of an ordered crystal into an amorphous phase. Amorphous phases are also referred to as glass phases. In this definition, the glass transition temperature observed with several material families is unimportant: to distinguish between a crystalline phase and an amorphous phase, use is generally made of an order parameter. An order parameter is described for example in: Schmidt, Rainer, "*Werkstoffverhalten in biologischen Systemen*", (1999), p. 58, doi:10.1007/978-3-642-60074-6. It is noted that it may be necessary to define an order parameter depending on the solid used, so that no general strategy can be offered for its definition. The value of the order parameter is referred to as the degree of order. Completely crystalline phases are generally described with a degree of order of 1. Amorphous is understood to be a largely disordered phase with a degree of order less than 0.5, preferably less than 0.2, particular preferably less than 0.1. A completely amorphous phase has a degree of order of 0. In very many cases, the Landau theory can also be used to define the order parameter. The aim of the amorphisation is to produce a completely closed, disordered layer, the surface whereof contributes in further process steps to the improvement of a bonding process.

There are two basic types of method for producing an amorphisation on a substrate surface.

In a first method, high-energy particles are fired onto the substrate surface, which amorphise an, in particular crystalline, structure. These methods are referred to in the following as amorphisation processes. Examples of amorphisation processes are ion beam processes and plasma processes.

In a second method according to the invention, materials are deposited on the substrate material. The material and the substrate material are preferably identical. These processes are referred to subsequently as deposition processes. Examples of deposition processes are chemical vapour deposition (CVD) and physical vapour deposition (PVD).

In an amorphisation process, the particles which strike the substrate surface have energies between 0.01 eV and 1000 eV, preferably between 0.1 eV and 100 eV, still more preferably between 1 eV and 10 eV. The penetration depth of the particles into the substrate material is greater than 0 nm, more preferably greater than 5 nm, still more preferably greater than 10 nm, most preferably greater than 25 nm, with utmost preference greater than 50 nm.

The thickness of the amorphous layer is less than 50 nm, preferably less than 20 nm, particularly preferably less than 10 nm, very particularly preferably less than 5 nm, in the optimum case less than 2 nm, in the ideal case less than 1 nm.

With the method according to the invention, substrates made of the same material or with different materials can be bonded together. The substrates preferably comprise functional units, conductor tracks, TSVs, bond islands (pads) etc. In particular, the substrates can also be hybrid substrates. A hybrid substrate is understood to mean a substrate which in particular comprises a dielectric at the surface, which surrounds electrically conductive regions, in particular bond islands and TSVs. The method according to the invention is also disclosed explicitly for the bonding of hybrid substrates. Here, the electrically conductive regions in particular can be amorphised with the aid of the method according to the invention. The surface of the dielectric is used for the prebonding. The amorphised electrically conductive regions make contact and are transformed from the amorphous into the crystalline state with the aid of the method according to the invention.

In particular, substrates of different materials can be bonded together with identical amorphous layers. Perfect transitions in the bonding interface are produced, at most with the exception of dislocations and grain boundaries. This method enables bonding of different materials, in particular of semiconductors, and the production of material transitions, in particular of semiconductor transitions.

Furthermore, a substrate provided with individual components, in particular with chips (chip to wafer bond), can be bonded using the method according to the invention.

Furthermore, chips can be bonded together using the method according to the invention. In particular, two transparent substrates provided with individual components can be used as carriers.

The cleanliness of the substrate surfaces reduces the interstratification of foreign atoms in the bonding interface, which increases the performance of the final product, since interfering influences are thus reduced.

The cleanliness of the substrate surfaces, in particular of the surfaces to be bonded, should therefore also be characterised. The foreign atom loading of the surfaces to be bonded should comprise, in particular per $cm^2$, material with in each case less than $50 \times 10^{10}$, preferably in each case less than $5 \times 10^{10}$, atoms of the chemical elements Ca, Cr, Co, Cu, Fe, K, Mn, Mo, Na, Ni, Ti and in each case less than $20 \times 10^{11}$, preferably in each case less than $1 \times 10^{11}$, atoms of the chemical elements Al, V, Zn. Possible detection methods are Atomic absorption spectrometry (AAS)
Atomic emission spectrometry (AES)
Energy-dispersive x-ray spectrometry (EDX)
Wavelength-dispersive x-ray spectrometry (WDX)
Radio spectrometry (OES)
Fluoresence methods
Atomic fluoresence spectroscopy (AFS)
X-ray fluorescence analysis (XRF)

For substrates with 200 mm diameter for particles with a measurement sensitivity of the 0.2 microns, the particle loading with foreign particles is less than 100 particles, preferably less than 75 particles, particularly preferably less than 60 particles.

For substrates with 300 mm diameter for particles with a measurement sensitivity of the 0.2 microns, the particle loading with foreign particles is less than 200 particles, preferably less than 150 particles, particularly preferably less than 115 particles.

A reduced, in particular minimised, particle loading of the surfaces to be bonded leads to a better prebond, which improves the electronic properties of the finished product produced according to the invention.

Furthermore, the surface to be bonded can be wetted in a normal clean room atmosphere at room temperature with at least one monolayer of water and monolayers of gases of the air components. In order to remove these components, heating over 100° C. in a vacuum at 1 bar, preferably at less than 0.5 bar, still more preferably is less than 0.1 mbar, most preferably at less than 0.01 mbar, with utmost preference less than 0.001 mbar and storage in an evacuated transport container or device is provided.

A further process parameter of the method according to the invention is the nature of the radiation. The radiation is absorbed in the amorphous layers and thus brings about the phase transformation. The wavelength and the intensity are used as parameters for the selection of the radiation source. Roughly classified, the radiation or its source can be used as a broadband emitter or a monochromatic emitter. A broadband emitter or the monochromatic emitter, in particular a laser, emits in the energy range between 1 eV and 10E8 eV, preferably between 1 eV and 10E6 eV, still more preferably between 1 eV and 10E4 eV, most preferably between 1 eV and 10 eV.

The radiant power of the radiation source lies between 0.01 Watt and 10000 Watt, preferably between 0.1 Watt and 1000 Watt, most preferably between 1 Watt and 100 Watt.

The radiation can be formed/directed by means of optical elements such as for example mirrors, lenses, prisms. The radiation can be formed into a radiation area with a homogeneous radiation distribution, wherein the area is adapted to the substrate stack to be irradiated, or can be generated by a linear source and/or a point-like source with a high power and a radiation cross-section of less than 5 $mm^2$, preferably less than 3 $mm^2$, particularly preferably less than 1 $mm^2$ measured at the point of incidence of the radiation.

In particular, locally limited temperatures above 200° C., preferably above 400° C., particularly preferably above 600° C., in the optimum case above 800° C., in the ideal case above 1200° C. can be reached by means of radiation in the amorphous phase for the phase transformation.

Depending on the thermal and optical parameters of the amorphous bonding interface to be transformed, the irradiation time is a control parameter for the effect of the radiation. The irradiation time, especially in the case of an unmoved substrate stack, can amount to less than 30 s, preferably less than 15 s, particularly preferably less than 1 s, very particularly preferably less than 100 ms. The effect of the phase transformation depends on the irradiation time and the degree of its effect on the amorphous phase in the bonding interface, so that time is regarded as an integral factor.

In particular, the radiation should strike normal (i.e. at an angle of 90°), i.e. perpendicular to the bonding interface, wherein a fluctuation of the angle of incidence of less than +/−5 degrees, preferably less than +/−3 degrees, particularly preferably less than +/−1 degree is permissible. In the case of flatter angles of incidence, the reflection component of the radiation is greater, so that an almost loss-free energy input is not guaranteed.

According to the invention, the parameters substrate temperature and atmosphere influence the physical effect of the phase transformation. Energy required that the reaction is split up into a general heat effect by means of conduction temperature control (heating or cooling), convection temperature control and radiation temperature control. Substrate heating increases the general thermal lattice oscillations in the crystal and of the atoms in the amorphous phase, so that additional heating to the radiation speeds up the reaction and is accordingly advantageous.

Cooling and/or temperature control is of importance for the reaction rates of the phase transformation, since a sufficient nucleation is promoted by means of temperature control, and the fault locations gain time to heal the defects. In other words, the thermal gradient between the substrate volume and the heated point in the amorphous phase can be better controlled or regulated by the additional variable of the ambient and substrate temperature control. Temperature control courses can thus be implemented in the optimum manner. The smaller the thermal gradient in the substrate stack is kept, the more stress-free becomes the finished product. In the temperature control, the differences in the thermal expansion coefficients (both linear and also in the volume) or in the thermal expansions are noted and corrected with computer-assisted control of the temperature course, to an extent such that the product has a low stress state thermally and mechanically.

The temperature control should diverge from the set temperature in each case by less than +/−5 degrees, preferably less than +/−3 degrees, in the optimum case less than +/−0.1 degrees.

An essential advantage of the method according to the invention is that, as a result of the local heating of the amorphous regions, the thermal expansion is also limited solely to local regions. The thermal expansion is primarily of relevance when substrates of different materials are to be bonded together, the thermal expansion coefficients of which greatly diverge from one another. Table 1 lists several typical semiconductor materials and their thermal expansion coefficients at room temperature.

Table 1 shows the approximate thermal expansion coefficients α at room temperature for different materials which are typically used in the semiconductor industry. The stated values of the thermal expansion coefficients are approximate guide values and fluctuate depending on the source stated in each case. The stated materials all belong to the cubic crystal system, so that their thermal expansion is isotropic.

TABLE 1

| Al | Ge | Au | Ag | Cu | InP | InSb | InAs | Si | AlN | GaAs | GaP | GaSb |
|---|---|---|---|---|---|---|---|---|---|---|---|---|
| $\alpha$ in $10^{-6}$ $K^{-1}$ | | | | | | | | | | | | |
| 23.1 | 5.8 | 14.2 | 18.9 | 16.5 | 4.75 | 5.37 | 4.52 | 2.6 | 4.5 | 5.8 | 4.5 | 7.75 |

The difference in the thermal expansion coefficients between two materials cannot be eliminated by the method according to the invention, but the thermal expansion can be limited to an extremely small range. If two semiconductor materials with very different thermal expansion coefficients are bonded together, a thermal expansion will arise directly in the vicinity of the amorphous layer which is transformed with the aid of the effect according to the invention into a crystalline layer, but this thermal expansion rapidly diminishes with increasing distance from the bonding interface. A very marked expansion or stress gradient thus arises. Particularly advantageously, the energy introduced into the bonding interface is even used solely for the purpose of performing the transformation from the amorphous into the crystalline state, without a notable heating of the bonding interface being carried out. The temperature gradient is thus minimised and therefore also the thermal expansions and stresses. This can preferably take place by means of a pulsed laser operation.

In an embodiment according to the invention, a temperature control of the substrate stack above 100° C., preferably above 200° C., particularly preferably above 300° C. is advantageous, in order that the thermal stresses in the substrate due to the phase transformation are reduced by the higher mobility of the crystalline lattice. In particular, fragile substrate materials can be bonded stress-free in processes taking place thermodynamically slowly.

In a preferred embodiment, the method according to the invention is carried out in a vacuum at less than 1 bar, preferably less than 0.1 mbar, still more preferably less than 0.01 mbar, most preferably less than 0.001 mbar, with utmost preference less than 0.0001 mbar. In particular, the bonding interface can be occupied by a monolayer of gas of a defined atmosphere, with which the foreign atoms can be introduced as doping into the amorphous phase.

In another embodiment, an evacuated device can prevent or slow down an agglomeration of fluids (gases or liquids and their vapours). An oxidation-free layer can thus be produced, i.e. amorphised. Furthermore, a substrate stack can be bonded without interrupting the vacuum. According to the invention, the pre-bonded substrate stack can, without interrupting the vacuum, also be post-treated thermally, in particular by means of radiation. Accordingly, the bonding interface is at least reduced, preferably completely eliminated, according to the invention.

The advantage of the embodiment in a vacuum is that even the edge zones of the substrate stack are bonded without the effects of the atmosphere, so that an improvement in the homogeneity of the bonding interface is brought about.

According to the invention, the absorption capacity of the substrate surface in the bonding interface for the radiation is greater than the absorption capacity of the substrate volume.

The substrate volume preferably comprises at least for the most part crystalline phases, in particular a monocrystalline phase, of the substrate material.

Since a radiation intensity at a workpiece is made up of reflection, absorption and transmission, reflection and transmission should also be taken into account. It is of particular importance for the method according to the invention to limit the reflection at the substrate surfaces and substrate stack surfaces to less than 4%, preferably less than 3%, particularly preferably less than 1% of the initial intensity of the radiation source. To achieve this, technical measures can be employed for the surface finish such as anti-reflection layers and/or moth-eye structures at the substrate surface lying opposite the bonding side. Furthermore, the coupling of the radiation and the avoidance of reflections can be promoted by means of liquid and/or liquid film between the radiation source and the substrate surface.

The transparency of the crystalline phases can, depending on the wavelength of the radiation source, be subject to a fluctuation of 10%, preferably 5%, particularly preferably 3%, very particularly preferably 1%. This is a material parameter, i.e. an adaptation of the radiation source to the given substrate material is provided.

Method

An exemplary sequence of the method of the invention is described below.

In a first (optional) process step, two substrates, a first substrate and a second substrate, are cleaned and/or pre-treated and/or at least partially freed from a natural oxide layer.

In a second process step, the first crystalline, in particular monocrystalline, substrate is provided with an amorphous layer by means of a surface treatment. Vapour deposition processes such as CVD or abrasive processes, in particular a plasma treatment or an ion beam treatment, can be used. The amorphous layer can thus either be deposited or can arise from the surface of the substrate. Optionally, an amorphous layer can also be produced on both substrates.

In a third (optional) process step, the substrates are aligned with one another.

In the fourth process step, the substrates are bonded to form a substrate stack. A check on the alignment of the pre-bonded substrate stack can then optionally take place.

In a fifth process step, the amorphous bonding interface is transformed into a crystalline phase using radiation according to the invention. After the process step, the amorphous phase quantity is thus less than 50%, preferably less than 40%, still more preferably less than 20%, most preferably less than 10%, with utmost preference 0%. Correspondingly after the process step, the crystalline phase quantity greater than 50%, preferably greater than 60%, still more preferably greater than 80%, most preferably greater than 90%, with utmost preference 100%. In particular, a complete transformation of the amorphous phase into a crystalline phase thus takes place. After the process step, the crystalline phase may have crystal defects such as interstitial and/or substitutional atoms, vacancies, edge dislocations, screw dislocations etc.

In a sixth, optional process step, the finished substrate stack is examined for successful bonding by means of imaging methods such as microscopy for defects and incomplete phase transformation.

Further advantages, features and details of the invention also emerge from the following description of preferred examples of embodiment and on the basis of the drawings.

BRIEF DESCRIPTION OF THE DRAWINGS

FIG. 1a shows a basic schematic representation of two substrates to be bonded,

FIG. 1b shows a basic schematic representation of two substrates to be bonded following an amorphisation of the surfaces to be bonded, FIG. 1c shows a basic schematic representation of the alignment of two substrates to be bonded FIG. 1d shows a substrate stack bonded with a prebond in a basic schematic representation, which has been formed by the two substrates to be bonded FIG. 1e shows the effect according to the invention of radiation on the amorphous layers of a substrate stack as a basic schematic representation, wherein the representation is not true to scale, FIG. 1f shows the completely heat-treated substrate stack in a basic schematic representation, FIG. 2 shows a basic schematic representation of three substrates which can be bonded using the method according to the invention, FIG. 5a shows schematically a substrate stack with amorphous layers, FIG. 5b shows schematically a substrate stack during irradiation and FIG. 5c shows schematically a substrate stack with crystalline structures.

Identical components or components with the same function are denoted with the same reference numbers in the figures. The figures are not true to scale.

DETAILED DESCRIPTION OF THE INVENTION

Figure 3:
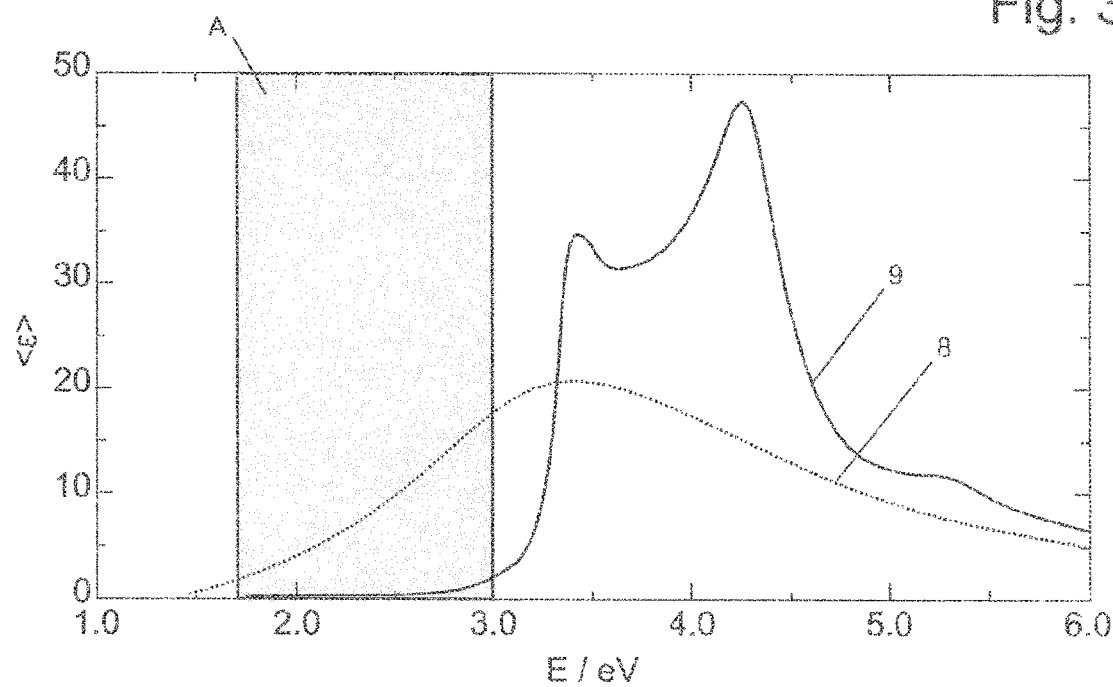
FIG. 3 shows a calculated absorption spectrum for amorphous and crystalline silicon.

FIG. 1a shows a basic schematic representation, not true to scale, of two substrates 1, 2 to be bonded. A first substrate 1 and a second substrate 2 are pretreated in a first optional process step. The pretreatment can comprise cleaning of the substrates free from chemical and/or physical impurities, for example from particles. Furthermore, an oxide present can be removed in particular wet-chemically and/or dry-chemically, in particular in a suitable vacuum installation with substrate processing. FIG. 1a shows a first process step of an exemplary method according to the invention.

For greater clarity, substrate holders, vacuum chamber, grippers, pre- and post-processing devices of the substrate processing device together with control, energy and media supply are not represented in the figures.

FIG. 1b shows a basic schematic representation, not true to scale, of substrates 1, 2 after an amorphisation of the surfaces to be bonded. First substrate 1 is provided in a device according to the invention (not represented) with a first thin amorphised layer 1a and second substrate 2 is provided in the device according to the invention (not represented) with a second thin amorphised layer 2a. FIG. 1b is a second process step of an exemplary method. Alternatively, it would be feasible to dispense with one of the two amorphised layers 1a, 2a.

FIG. 1c shows a basic schematic representation, not true to scale, of the alignment of substrates 1, 2 to be bonded. First substrate 1 with first amorphous layer 1a is aligned relative to second substrate 2 with second amorphous layer 2a in such a way that amorphous layers 1a, 2a lie on mutually facing surfaces 1o, 2o of amorphous layers 1o, 2o. An alignment device is thereby expressly disclosed, but is represented only symbolically with movement direction arrows P. FIG. 1c is a third process step of an exemplary method according to the invention.

FIG. 1d shows a substrate stack 3 bonded with a prebond in a basic schematic representation not true to scale, which substrate stack has arisen from the two substrates 1 and 2 to be bonded. Amorphous layers 1a and 2a have been joined together by means of the prebond. FIG. 1d shows a fourth process step.

FIG. 1e shows an effect according to the invention of radiation 5 on amorphous layers 1a and/or 2a of substrate stack 3, which has been formed from substrates 1, 2. A radiation source 4 generates radiation 5. The arrows symbolise a relative movement between radiation source 4 and substrate stack 3. In particular, radiation 5 can scan over substrate stack 3 in a grid-like manner. In another embodiment, the movement trajectory of the relative movement of a regulation and/or control can be stored, in particular in a control computer not represented, and implemented as a prescribed procedure. Optimum path curves for the minimised thermal loading of substrate regions with temperature-sensitive zones can thus be produced. The modelling and/or calculation of the trajectory can take place on the basis of simulations such as FEM or coupled thermal-mechanical modelling. Thus, all the parameters mentioned earlier can be used for establishing and/or adapting the irradiation time, irradiation location and irradiation path and irradiation intensity of the radiation. FIG. 1e shows a fifth process step.

FIG. 1f shows the heat-treated substrate stack according to the invention in a basic schematic representation, wherein the representation is not true to scale. In the fifth process step carried out according to the invention, the entire bonding interface or the entire amorphous phase has been transformed into a crystalline phase. The substrate stack is thus permanently bonded inseparably.

FIG. 2 shows a basic schematic representation of three substrates 1, 2, 6, which are bonded with the method according to the invention in another embodiment, wherein the representation is not true to scale. A first substrate 1 and a second substrate 2 each receive at least one amorphous layer 1a, 2a. A third substrate 6, with which the substrate material does not have to be transparent for the radiation, has two amorphous layers 6a. After the joining of substrates 1 and 2 to substrate 6, a phase transformation according to the invention on both sides simultaneously or offset in time can produce a substrate stack (not represented) comprising more than two substrates. A substrate stack comprising three substrates, preferably comprising four substrates, particularly preferably comprising more than five substrates can expediently be produced using the disclosed method.

The following diagram descriptions show, on the basis of calculated data, the absorption and refractive-index behaviour of amorphous and crystalline silicon. The two diagrams are to be regarded as an illustrative example for all other materials, which in certain wavelength ranges exhibit the same behaviour as silicon.

FIG. 3 shows two calculated absorption spectra for amorphous (dotted lines 8) and crystalline (continuous line 9) Si. The diagram shows absorption index ε as a function of the particle energy, in particular photon energy in eV. Continuous line 9 represents the absorption behaviour of Si in the crystalline phase as a function of the particle energy. Dotted line 8 represents the absorption behaviour of Si in the amorphous phase as a function of the particle energy. In particle energy range A between approx. 1.8 eV and 3.0 eV, it can be seen that the amorphous phase has an absorption capacity that is higher by the factor 0.2-18 than the crystalline phase. Particles which have a particle energy between 1.8 eV and 3.0 eV are scarcely absorbed by the crystalline phase, but very much so by the amorphous phase.

The disclosed method thus utilises ranges of the spectrum in which the absorption of the amorphous phase is greater, in particular at least 1.1 times greater, preferably 2 times greater, still more preferably more than 5 times greater, most preferably more than 10 times greater, with utmost preference more than 20 times greater than the absorption of the crystalline phase.

Figure 4:
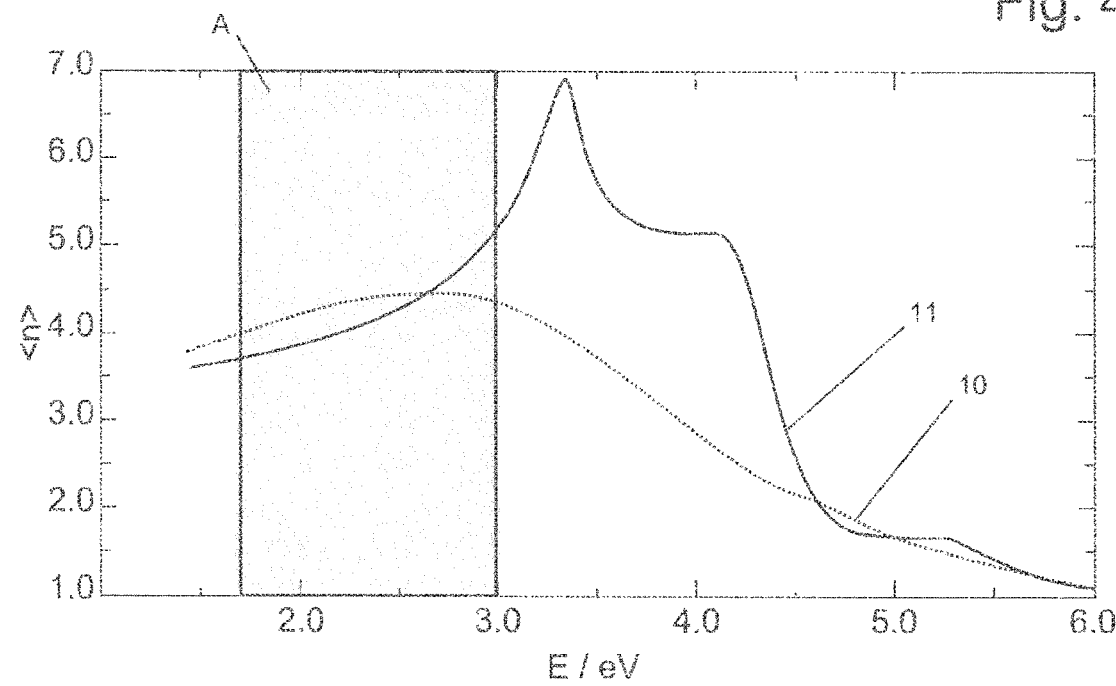
FIG. 4 shows a diagram of the refractive index as a function of the particle energy for amorphous and crystalline silicon.

FIG. 4 shows two calculated refractive index graphs 10, 11 for amorphous (dotted line 10) and crystalline (continuous line 11) Si. The diagram shows refractive index n as a function of particle energy eV, in particular photon energy. In particle energy range A between approx. 1.8 eV and 3.0 eV, it can be seen that refractive indices n of amorphous and crystalline Si are very similar. All physical processes which are based solely on the refractive index are therefore very similar in this particle energy range A for amorphous and crystalline silicon.

The same considerations apply to crystalline material mixtures with amorphised phases, insofar as the amorphous phase can be transformed residue-free into a crystalline phase.

FIG. 5a shows an enlarged substrate stack 3 (not true to scale) of two substrates 1, 2 with corresponding amorphous layers 1a, 2a. Individual atoms a1, a2 can be seen, from which the crystalline phases of substrates 1a, 2a and the amorphous phases of amorphous layers 1a, 2a are built up. Atoms a1 of the crystalline phases of substrates 1, 2 are ordered, atoms a2 of amorphous phases 1a, 2a are disordered.

FIG. 5b shows enlarged substrate stack 3 (not true to scale) of substrates 1, 2 with corresponding amorphous layers 1a, 2a, which are treated with radiation 5. Radiation 5 penetrates essentially unhindered through crystalline substrate 2, but is then absorbed by amorphous layers 1a, 2a. The areas which radiation 5 has already struck are already crystallised.

FIG. 5c shows enlarged substrate stack 3 (not true to scale) of two substrates 1, 2 bonded together almost perfectly without corresponding amorphous layers 1a, 2a. A dislocation 7 at the right-hand edge of the figure can be seen. Represented dislocation 7 is an edge dislocation. It has been marked at its lower end with a symbol known to the person skilled in the art, and additionally outlined with a dashed line. Edge dislocation 7 represents an additional row of atoms introduced between the otherwise perfect lattice. The distortion of the lattice atoms arising in the vicinity of dislocation 7 can be seen. Such defects are known to the person skilled in the art in the field. It is explicitly mentioned that such defects may arise with the method according to the invention, but do not have to arise.

LIST OF REFERENCE NUMBERS

1 First substrate
1a First amorphous layer of a first substrate
1o Bonding surface of the first layer
2 Second substrate
2a Second amorphous layer of a second substrate
2o Bonding surface of the second layer
3 Substrate stack
4 Radiation source of the radiation
5 Radiation
6 Third substrate
6a Amorphous layer of the third substrate
7 Dislocation
8, 9 Absorption spectrum
10, 11 Refractive index graph
a1, a2 Atoms
A Particle energy range
ε Absorption index
n Refractive index
P Movement arrows Having described the invention, the following is claimed:

1. A method for bonding a first substrate with a second substrate, said method comprising:
producing a first amorphous layer on the first substrate and/or producing a second amorphous layer on the second substrate,
bonding of the first substrate with the second substrate at the first amorphous layer and/or the second amorphous layer to form a substrate stack,
irradiating the first amorphous layer and/or the second amorphous layer with a radiation having a radiant energy such that at least a portion of the first amorphous layer and/or the second amorphous layer is/are transformed into a crystalline layer or crystalline layers,
wherein the first amorphous layer and/or the second amorphous layer in a particle energy region between 1.8 eV and 3.0 eV have an amorphous phase with an absorption capacity that is higher than an absorption capacity of a crystalline phase by a factor in a range of 0.2 to 18.

2. The method according to claim 1, wherein the first amorphous layer and/or the second amorphous layer is/are transformed at least partially into the crystalline layer/crystalline layers.

3. The method according to claim 1, wherein the first amorphous layer and/or the second amorphous layer is produced on at least a portion of a respective bonding surface of the first and second substrates.

4. The method according to claim 1, wherein at least one of the first and second substrates is transparent for the radiation, wherein at least 50% of the radiant energy of the radiation passes therethrough.

5. The method according to claim 1, wherein the first amorphous layer and/or the second amorphous layer absorbs more than 60% of the radiant energy of the radiation.

6. The method according to claim 1, wherein the radiation is laser radiation, wherein the method includes focusing the laser radiation on the first amorphous layer and/or the second amorphous layer.

7. The method according to claim 1, wherein the method includes striking the first amorphous layer and/or the second amorphous layer with the radiation at right angles.

8. The method according to claim 1, wherein the method includes generating the radiation by use of a broadband emitter, which emits energy in a range between 1 eV and 10E8 eV.

9. The method according to claim 1, wherein the radiation has a radiant power in a range between 0.01 Watt and 10000 Watt.

10. The method according to claim 1, wherein said irradiating of the first amorphous layer and/or the second amorphous layer with the radiation produces temperatures of over 200° C.

11. The method according to claim 1, wherein a time for the irradiating of the first amorphous layer and/or the second amorphous layer is less than 30 seconds.

12. The method according to claim 1, wherein the radiation is reflected at respective surfaces of the first and second substrates and/or surfaces of the substrate stack at less than 4% of an output intensity of a radiation source.

13. The method according to claim 1, wherein the first substrate and/or the second substrate is transparent to the radiation up to at least 95% of an output intensity of a radiation source.

14. The method according to claim 1, wherein before and/or during said irradiating, at least one of the first and second substrates is heated above 100° C.

15. A substrate stack comprising at least a first substrate and a second substrate, said first and second substrates bonded to each other by the method according to claim 1.

* * * * *